(12) United States Patent
Uratani

(10) Patent No.: US 11,764,335 B2
(45) Date of Patent: Sep. 19, 2023

(54) SEMICONDUCTOR LIGHT EMITTING DEVICE

(71) Applicant: STANLEY ELECTRIC CO., LTD., Tokyo (JP)

(72) Inventor: Yudai Uratani, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 265 days.

(21) Appl. No.: 17/380,211

(22) Filed: Jul. 20, 2021

(65) Prior Publication Data

US 2022/0029065 A1 Jan. 27, 2022

(30) Foreign Application Priority Data

Jul. 22, 2020 (JP) .................. 2020-125826

(51) Int. Cl.
*H01L 33/48* (2010.01)
(52) U.S. Cl.
CPC .................. *H01L 33/486* (2013.01)
(58) Field of Classification Search
CPC ........ H01L 33/58; H01L 33/486; H01L 33/56
See application file for complete search history.

(56) References Cited

U.S. PATENT DOCUMENTS

| 9,818,923 | B2 | 11/2017 | Ueda et al. |
| 10,439,100 | B2 | 10/2019 | Niizeki et al. |
| 2012/0120664 | A1* | 5/2012 | Farmer ................ F21V 29/70 362/294 |
| 2014/0124812 | A1* | 5/2014 | Kuramoto ............ H01L 24/97 438/27 |
| 2018/0195677 | A1* | 7/2018 | Konagayoshi ........ F21V 15/01 |

FOREIGN PATENT DOCUMENTS

| JP | 2003212598 A | 7/2003 |
| JP | 2015018873 A | 1/2015 |
| JP | 2016127249 A | 7/2016 |

(Continued)

OTHER PUBLICATIONS

"Tohoku University, Mitsui Mining & Smelting Co., Ltd.,", https://www.mitsui-kinzoku.co.jp/wp-conten/uploads/topics_190130.pdf, Mar. 4, 2020.

(Continued)

*Primary Examiner* — Jonathan Han
(74) *Attorney, Agent, or Firm* — Holtz, Holtz & Volek PC

(57) ABSTRACT

A semiconductor light emitting device has: a semiconductor light emitting element; a substrate on which the semiconductor light emitting element is mounted and which includes a substrate bonding surface to which a substrate metal layer having an annular shape is fixed; and a light transmitting cap including a window portion containing glass and transmitting radiation light of the semiconductor light emitting element and a flange having a bottom surface to which an annular flange fixation layer having a size corresponding to the substrate metal layer is fixed, and sealed and bonded to the substrate with a space housing the semiconductor light emitting element by bonding of the flange fixation layer to the substrate metal layer. The flange fixation layer contains a ceramic layer welded to the flange and a metal layer formed on the ceramic layer.

13 Claims, 6 Drawing Sheets

(56) References Cited

FOREIGN PATENT DOCUMENTS

JP          2016127255 A    7/2016
JP          2018093137 A    6/2018

OTHER PUBLICATIONS

Related U.S. Appl. No. 17/337,605, First Named Inventor: Kenji Ikeda; Title: "Semiconductor Light Emitting Device", filed Jun. 3, 2021.
Related U.S. Appl. No. 17/376,317, First Named Inventor: Minoru Tanaka; Title: "Semiconductor Light Emitting Device", filed Jul. 15, 2021.
Asuzac Inc., http://www.asuzac-ceramics.jp/technology/tech15.htm.
Japan Thermal Spray Society, http://www.jtss.or.jp/about_ts-j.htm.
Jeno, Jis H 8304: Ceramic Sprayed Coatings revised in 2014, http://www.jtss.or.jp/journal/8304review.pdf.

* cited by examiner

SEMICONDUCTOR LIGHT EMITTING DEVICE

BACKGROUND OF THE INVENTION

1. Field of the Invention

The present invention relates to a semiconductor light emitting device and particularly relates to a semiconductor light emitting device in which a semiconductor light emitting element radiating ultraviolet light is sealed inside.

2. Description of the Related Art

Conventionally, a semiconductor device is known in which a semiconductor element is sealed inside a semiconductor package. In the case of a semiconductor light emitting module, a transparent window member, such as glass, transmitting light from a light emitting element is bonded to a support on which the semiconductor light emitting element is placed and hermetically sealed.

For example, Patent Literatures (PTLS) 1, 2 disclose semiconductor light emitting modules in which a substrate provided with a recessed portion housing a semiconductor light emitting element and a window member are bonded to each other.

PTLS 3, 4 disclose ultraviolet light emitting devices in which a mounting substrate mounted with an ultraviolet light emitting element, spacers, and a cover formed of glass are bonded to one another.

PTL 5 discloses a quartz glass having a surface coated with a thermally sprayed ceramic film and the attachment property of the thermally sprayed film in the ceramic.

Non-PTL 1 and Non-PTL 2 disclose a technique of thermally spraying ceramic. Non-PTL 3 discloses alumina-based ceramic with a black tone "Black Alumina (AR(B))".

CITATION LIST

Patent Literatures

PTL 1: JP 2015-18873 A
PTL 2: JP 2018-93137 A
PTL 3: JP 2016-127255 A
PTL 4: JP 2016-127249 A
PTL 5: JP 2003-212598 A

Non-Patent Literatures

Non-PTL 1: Japan Thermal Spray Society, http://www.jts-s.or.jp/about_ts-j.htm
Non-PTL 2: Kazuo Ueno: "JIS H 8304: Ceramic Sprayed Coatings", revised in 2014, http://www.jtss.or.jp/journal/8304review.pdf
Non-PTL 3: ASUZAC Inc., http://www.asuzac-ceramics.jp/technology/tech15.htm However, a further improvement has been demanded for the sealability and the bond reliability between the substrate and the window member. A semiconductor light emitting element radiating ultraviolet light, particularly an AlGaN-based semiconductor light emitting element, is susceptible to deterioration when the hermeticity is insufficient, and thus a semiconductor device mounted with the semiconductor light emitting element is demanded to have high hermeticity.

AlGaN-based crystals deteriorate by moisture. In particular, as the light emission wavelength becomes shorter, the Al composition increases and is more susceptible to deterioration. Thus, as a airtight structure in which moisture does not enter the inside of a package housing the light emitting element, a structure of hermetically sealing between a substrate and a glass lid with a metal bonding material has been adopted. However, there has been a problem that the hermeticity is insufficient when used in a humid environment or water sections.

Further, there has been a problem that particularly glass, such as quartz, transmitting ultraviolet light or deep ultraviolet light has high glass purity or hardness and has low adhesiveness with metal.

SUMMARY OF THE INVENTION

The present invention has been made in view of the above-described respects. It is an object of the present invention to provide a semiconductor device having high reliability with which high hermeticity is maintained even in long-term use and high environmental resistance, such as moisture resistance and corrosion resistance.

A semiconductor light emitting device according to one embodiment of the present invention has:

a semiconductor light emitting element;

a substrate on which the semiconductor light emitting element is mounted and which includes a substrate bonding surface to which a substrate metal layer having an annular shape is fixed; and a light transmitting cap including a window portion containing glass and transmitting radiation light of the semiconductor light emitting element and a flange having a bottom surface to which an annular flange fixation layer having a size corresponding to the substrate metal layer is fixed, and sealed and bonded to the substrate with a space housing the semiconductor light emitting element by bonding of the flange fixation layer to the substrate metal layer, in which the flange fixation layer contains a ceramic layer welded to the flange and a metal layer formed on the ceramic layer.

DESCRIPTION OF THE PREFERRED EMBODIMENTS

First Embodiment

Figure 1A:
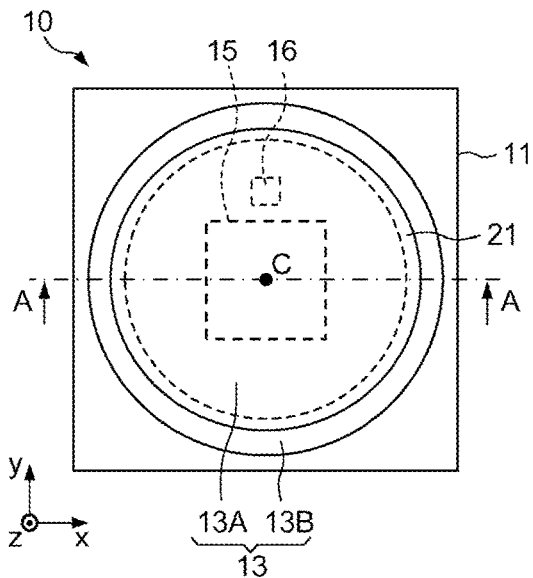
FIG. 1A is a plan view schematically illustrating the upper surface of a semiconductor light emitting device 10 according to a first embodiment.
Figure 1B:
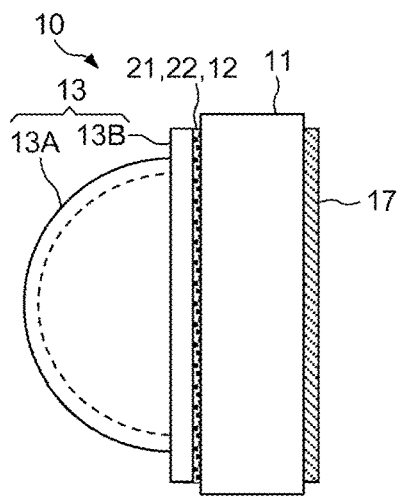
FIG. 1B is a view schematically illustrating a side surface of the semiconductor light emitting device 10.
Figure 1C:
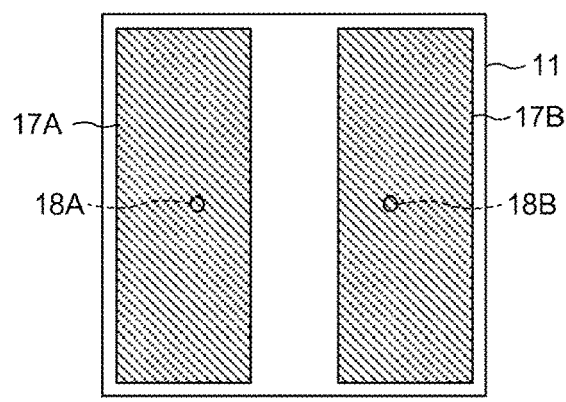
FIG. 1C is a plan view schematically illustrating the rear surface of the semiconductor light emitting device 10.
Figure 1D:
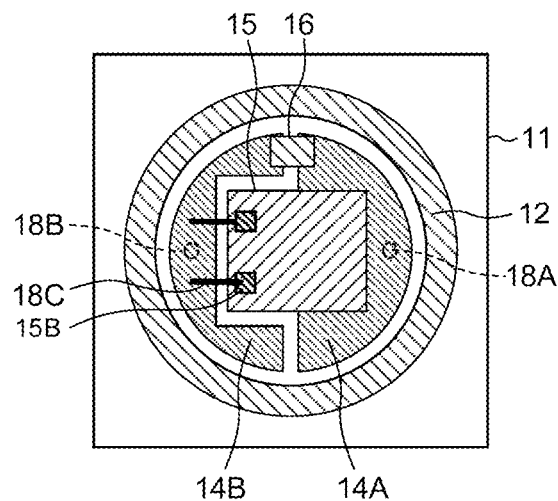
FIG. 1D is a view schematically illustrating the internal structure of the semiconductor light emitting device 10.
Figure 1E:
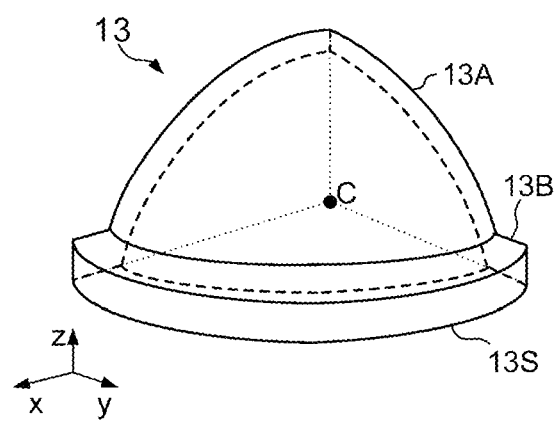
FIG. 1E is a perspective view schematically illustrating a ¼ part of a light transmitting cap 13 of the first embodiment.

FIG. 1A is a plan view schematically illustrating the upper surface of a semiconductor light emitting device 10 according to a first embodiment of the present invention. FIG. 1B is a view schematically illustrating a side surface of the semiconductor light emitting device 10. FIG. 1C is a plan view schematically illustrating the rear surface of the semiconductor light emitting device 10. FIG. 1D is a view schematically illustrating the internal structure of the semiconductor light emitting device 10. FIG. 1E is a perspective view schematically illustrating a ¼ part of a light transmitting cap 13 of the first embodiment.

Figure 2A:
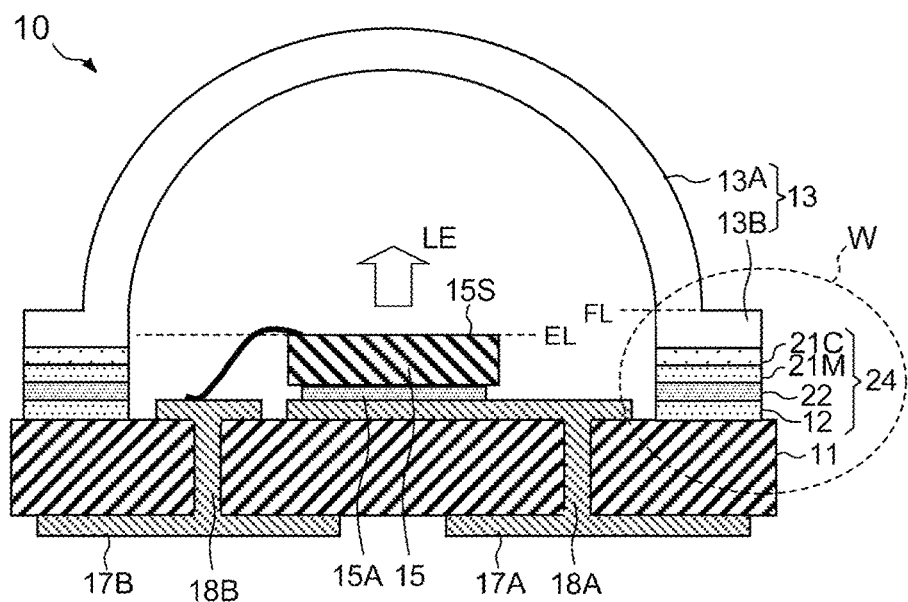
FIG. 2A is a cross-sectional view schematically illustrating the cross section of the semiconductor light emitting device 10 along the A-A line of FIG. 1A.
Figure 2B:
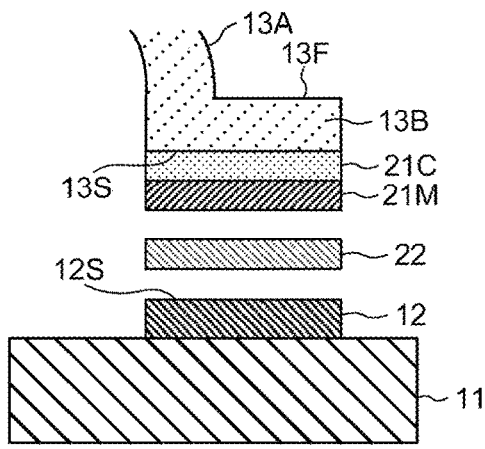
FIG. 2B is a partially enlarged cross-sectional view illustrating the cross section of a bonded portion (W part) of FIG. 2A in an enlarged manner.

FIG. 2A is a cross-sectional view schematically illustrating the cross section of the semiconductor light emitting device 10 along the A-A line of FIG. 1A. FIG. 2B is a partially enlarged cross-sectional view illustrating the cross section of a bonded portion (W part) of FIG. 2A in an enlarged manner.

As illustrated in FIG. 1A and FIG. 1B, the semiconductor light emitting device 10 is formed by bonding a rectangular plate-like substrate 11 and the light transmitting cap 13 which is a semispherical light transmissive window containing glass. More specifically, an annular ring-shaped metal layer 12 (hereinafter also referred to as a substrate metal layer 12) is formed on the upper surface of the substrate 11 and bonded to the light transmitting cap 13.

The figures are illustrated assuming that the side surfaces of the substrate 11 are parallel to the x-direction and the y-direction and that the upper surface of the substrate 11 is parallel to the xy-plane.

As illustrated in FIG. 1E and FIG. 2A, the light transmitting cap 13 contains a semispherical dome portion 13A, which is a window portion, and a flange portion (hereinafter simply referred to as a flange) 13B provided at an end portion of a bottom portion of the dome portion 13A. More specifically, the light transmitting cap 13 is formed by hermetically connecting the dome portion 13A (window portion) and the flange 13B.

FIG. 2B illustrates the flange 13B, a ceramic layer 21C welded to the flange 13B, and a metal layer (flange metal layer) 21M fixed to the ceramic layer 21C in an enlarged manner. In this specification, when these layers are not particularly distinguished from each other, layers containing the ceramic layer 21C and the metal layer 21M are collectively referred to as a flange fixation layer 21. The flange 13B has an annular-ring plate shape.

The substrate 11 is a gas-impermeable ceramic substrate. For example, aluminum nitride (AlN) having high thermal conductivity and excellent hermeticity is used. AlN ceramic has a thermal conductivity of 150 to 170 (W/m·K) and a coefficient of thermal expansion of 4.5 to 4.6 ($10^{-6} \cdot K^{-1}$).

As a base material of the substrate 11, silicon carbide (SiC) having high thermal conductivity, white alumina ($Al_2O_3$) having high reflectivity, and the like are mentioned. SiC has a thermal conductivity of 200 (W/m·K) and a coefficient of thermal expansion of 4.4 ($10^{-6} \cdot K^{-1}$). $Al_2O_3$ has a thermal conductivity of 29 to 32 (W/m·K) and a coefficient of thermal expansion of 7.7 to 8 ($10^{-6} \cdot K^{-1}$).

The light transmitting cap 13 contains a light transmissive glass transmitting radiation light from a semiconductor light emitting element 15 arranged in the semiconductor light emitting device 10. For example, quartz glass or borosilicate glass can be suitably used.

As a sealing gas in the semiconductor light emitting device 10, a dry nitrogen gas or a dry air with a low oxygen content is usable or a vacuum may be created inside.

As illustrated in FIG. 1D, the substrate 11 is provided thereon with a first wiring electrode (e.g., anode electrode) 14A and a second wiring electrode (e.g., cathode electrode) 14B, which are wiring electrodes in the semiconductor light emitting device 10 (hereinafter referred to as wiring electrodes 14 unless otherwise particularly distinguished). The semiconductor light emitting element 15, such as a light emitting diode (LED) or a semiconductor laser, is bonded onto the first wiring electrode 14A by a metal bonding layer 15A. A bonding pad 15B of the light emitting element 15 is electrically connected to the second wiring electrode 14B through a bonding wire 18C.

The light emitting element 15 is an aluminum gallium nitride (AlGaN)-based semiconductor light emitting element (LED) in which a semiconductor structure layer containing an n-type semiconductor layer, a light emitting layer, and a p-type semiconductor layer is formed. In the light emitting element 15, the semiconductor structure layer is formed (bonded) on (onto) a conductive support substrate (silicon: Si) through a reflective layer.

The light emitting element 15 is provided with an anode electrode (not illustrated) on the opposite surface (also referred to as the rear surface of the light emitting element 15) to a surface to which the semiconductor structure layer is bonded of the support substrate and is electrically connected to the first wiring electrode 14A on the substrate 11. Further, the light emitting element 15 is provided with a cathode electrode (pad 15B) on the opposite surface (also referred to as the front surface of the light emitting element 15) to which the support substrate is bonded of the semiconductor structure layer and is electrically connected to the second wiring electrode 14B through a bonding wire.

The light emitting element 15 is suitably an aluminum nitride-based light emitting element emitting ultraviolet light with a wavelength of 265 to 415 nm. Specifically, a light emitting element with a light emission center wavelength of 265 nm, 275 nm, 355 nm, 365 nm, 385 nm, 405 nm, or 415 nm was used.

The Al composition of semiconductor crystals constituting an aluminum nitride-based light emitting element radiating ultraviolet light (UV-LED element) is high and the light emitting element is easily oxidized and deteriorates by oxygen ($O_2$) or moisture ($H_2O$). When a bonding member containing organic matter, such as flux, is used for the bonding of the light emitting element 15 to the first wiring electrode 14A, carbides are deposited on the front surface of the light emitting element due to residual flux (organic matter) in the bonding member. However, the carbide deposition can be prevented by mixing a slight amount of $O_2$ into the sealing gas. At this time, $O_2$ is inactivated before deteriorating the light emitting element 15, and therefore no problems occur.

On the substrate 11, a protective element 16, which is a Zener Diode (ZD), connected to the first wiring electrode 14A and the second wiring electrode 14B is provided and prevents electrostatic breakdown of the light emitting element 15.

As illustrated in FIG. 1C, the substrate is provided, on the rear surface 11, with a first mounting electrode 17A and a second mounting electrode 17B (hereinafter referred to as mounting electrodes 17 unless otherwise particularly distinguished) connected to the first wiring electrode 14A and the second wiring electrode 14B, respectively. Specifically, the first wiring electrode 14A and the second wiring electrode 14B are connected to the first mounting electrode 17A and the second mounting electrode 17B through metal vias 18A and 18B (hereinafter referred to as metal vias 18 unless otherwise particularly distinguished), respectively.

The wiring electrodes 14, the mounting electrodes 17, and the metal vias 18 are, for example, tungsten/nickel/gold (W/Ni/Au) or nickel chromium/gold/nickel/gold (NiCr/Au/Ni/Au).

Referring to FIG. 2A, the semiconductor light emitting device 10 is configured to be mounted on a wiring circuit board (not illustrated), and, by the application of a voltage to the first mounting electrode 17A and the second mounting electrode 17B, the light emitting element 15 emits light, and radiation light LE from the front surface (light extraction surface) of the light emitting element 15 is radiated to the outside through the light transmitting cap 13.

Next, the bonding of the substrate 11 and the flange 13B of the light transmitting cap 13 is described.
(Light Transmitting Cap 13 and Flange 13B)

As illustrated in FIG. 1A, FIG. 1B, and FIG. 1E, the light transmitting cap 13 includes the semispherical dome portion 13A, which is the window portion, and the flange 13B extended from the bottom portion (end portion) of the dome portion 13A. The flange 13B has a cylindrical outer shape. In more detail, the bottom surface of the flange 13B has an annular ring shape (center: C) concentric with the center of the dome portion 13A. More specifically, the outer edge (outer periphery) of the flange 13B is concentric with the inner edge (inner periphery) of the flange 13B.
(Flange Fixation Layer 21)

FIG. 2B is a cross-sectional view schematically illustrating a state before the bonding of the substrate 11 and the light transmitting cap 13. As described above, the flange 13B has the ceramic layer 21C welded to a bottom surface (flange bonding surface) 13S of the flange 13B and the metal layer 21M fixed to the ceramic layer 21C.

By the bonding of the flange fixation layer 21 onto the substrate metal layer 12 by a cap bonding layer 22, a bonded portion 24 is formed (see FIG. 2A) and the hermeticity between the substrate 11 and the light transmitting cap 13 is maintained.

The bottom surface 13S of the flange 13B is flat but may be roughened or grooved to enhance the fixing property of the ceramic layer 21C.

In more detail, white alumina or black alumina is usable for the ceramic layer 21C. As the black alumina, black alumina with a black tone (AR(B)) (manufactured by ASUZAC Inc.) is mentioned, for example, and can suppress surface reflection while maintaining the strength and durability which are the characteristics of fine ceramic (The reflectance is 5.1 to 15.3% at wavelengths of 240 to 2600 nm). The white alumina is alumina-based fine ceramic used for semiconductor or liquid crystal manufacturing devices and has a white or ivory tone.

As the main component of the glass is silicon oxide ($SiO_2$), and therefore has a high fixing property with ceramic containing oxygen (O) elements, such as zirconia and magnesia, and ceramic containing silicon (Si) elements, such as silicon carbide and silicon nitride, in addition to alumina. The ceramic is also usable as a single body or a complex.

For the ceramic layer 21C, light reflecting ceramic diffusing and reflecting light or light absorbing ceramic absorbing light is usable. Meanwhile, metal enters uneven parts of the front surface containing fine grain boundaries of ceramic which is polycrystal, and therefore the intervention of the ceramic layer 21C can prevent the peeling of the metal layer 21M from the flange 13B. By selecting metals which are easily oxidized, such as chromium (Cr), titanium (Ti), and nickel (Ni), for metal in contact with the ceramic layer 21C of oxide of the metal layer 21M, a part of the metal is bonded to the ceramic, and therefore a high fixing property can be obtained. Similarly, by selecting metals which are easily nitrided, such as chromium (Cr), titanium (Ti), and tungsten (W), for metal in contact with the ceramic layer 21C of nitride of the metal layer 21M, a part of this metal is bonded to the ceramic, and therefore a high fixing property can be obtained.

For the metal layer 21M, a chromium/nickel/gold (Cr/Ni/Au) layer, a titanium/palladium/copper/nickel/gold (Ti/Pd/Cu/Ni/Au) layer (with the Au layer being the outermost surface layer), or the like is usable, for example.

The above-described ceramic layer 21C can be formed, for example, by charging ceramic powder and the like into a high-temperature and high-speed plasma jet and spraying the resultant substance onto glass as high-speed molten particles (plasma spraying method). The metal layer 21M can also be formed by a similar plasma spraying method, an electron beam evaporation method, or the like.
(Substrate Metal Layer 12)

As illustrated in FIG. 1A and FIG. 1D, the substrate metal layer 12 which is a metal ring body having an annular ring shape is fixed onto the substrate 11, and a substrate bonding surface 12S (front surface of the substrate metal layer 12) is formed. In more detail, a bonding region of the substrate 11 to which the substrate metal layer 12 is fixed is flat and the substrate metal layer 12 has a shape (i.e., annular ring shape) and a size corresponding to those of the bottom surface 13S of the flange 13B. Alternatively, the substrate metal layer 12 has a size including the entire of the flange fixation layer 21 of the bottom surface 13S of the flange 13B. In the same manner as above, a high fixing property can be obtained by selecting metals which are easily nitrided (or oxidized in the case of ceramic oxide) for metal in contact with base material ceramic of the substrate 11.

The substrate metal layer 12 has, on the substrate 11, a structure in which tungsten, nickel, and gold are laminated in this order (W/Ni/Au) or a structure in which nickel chromium, gold, nickel, and gold are laminated in this order (NiCr/Au/Ni/Au).

The substrate metal layer 12 is formed to be electrically insulated from the first wiring electrode 14A, the second wiring electrode 14B, the light emitting element 15, and the protective element 16 and surround them.

An annular ring-shaped bonding material is placed on the annular ring-shaped substrate metal layer 12 and a force F is applied to the light transmitting cap 13 for pressing while heating, thereby forming the cap bonding layer 22 having an annular ring shape, to which the light transmitting cap 13 is bonded, on the substrate 11 as illustrated in FIG. 2A.

The bonding material serving as the cap bonding layer 22 is a flux-free annular ring-shaped AuSn (gold-tin) sheet and one containing 20 wt % Sn (melting temperature: about 280° C.) was used, for example. On both the surfaces of the gold-tin alloy sheet, an Au layer (10 to 30 nm) layer can also be provided. The oxidation of an AuSn alloy can be prevented and uniform melting is enabled in a cap bonding step described later, and therefore the hermeticity can be improved. The Au layer is dissolved into the cap bonding layer 22 in melting and solidification (bonding).

[Method for Manufacturing Light Emitting Device 10]

Hereinafter, a method for manufacturing the light emitting device 10 is described in detail and specifically.

(Element Bonding Step)

First, a volatile solder paste for element bonding is applied onto the first wiring electrode 14A of the substrate 11. As the volatile solder paste, a volatile solder paste containing a flux with a boiling point around the melting point and gold-tin alloy (Au—Sn) fine particles was used. As the composition of the gold-tin alloy, one containing 20 wt % Au—Sn with a melting temperature of about 280° C. was used. The particle size ranges from several nanometers to several tens of micrometers. Examples of the flux include, for example, rosins, alcohols, saccharides, esters, fatty acids, oils and fats, polymerized oils, surfactants, organic acids, and the like which are carbonized with light (365 nm) of the light emitting element 15.

Next, the light emitting element 15 is placed on the volatile solder paste, the substrate is heated to 300° C. to melt and solidify the AuSn to bond the light emitting element 15 onto the first wiring electrode 14A. When the protective element 16 is to be mounted, the mounting is performed at the same time. At this time, most of the flux contained in the volatile solder paste is volatilized.

Next, the bonding pad 15B of an upper electrode of the light emitting element 15 and the second wiring electrode 14B are electrically connected by the bonding wire 18C (Au wire).

(Cap Bonding Step)

The substrate 11 after an excimer laser cleaning step and the light transmitting cap 13 are set in a cap bonding device. Next, the atmosphere of the substrate 11 and the light transmitting cap 13 is brought into a vacuum state and heated (annealed) at a temperature of 275° C. for 15 minutes.

Subsequently, the atmosphere of the substrate 11 and the light transmitting cap 13 is filled with 1 atm (101.3 kPa) of dry nitrogen ($N_2$) gas, which is a sealing gas. Next, as illustrated in FIG. 2B, the annular AuSn sheet (bonding material of the cap bonding layer 22) is placed on the substrate metal layer 12 of the substrate 11, and the light transmitting cap 13 is further placed thereon and pressed.

The temperature is increased to 300° C. while pressing the light transmitting cap 13 against the annular AuSn sheet. By the heating, the AuSn sheet is melted, and then solidified by cooling while melting a slight amount of the gold of the metal layers 12 and 21M. As described above, the substrate 11 and the light transmitting cap 13 are bonded to complete the semiconductor light emitting device 10.

[Ceramic Layer 21C of Flange 13B]

Figure 3A:
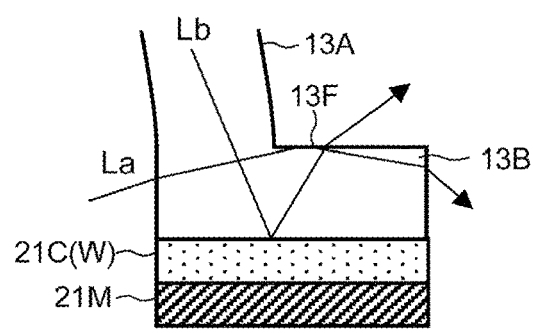
FIG. 3A is a partially enlarged cross-sectional view illustrating a portion of a flange 13B and a flange fixation layer 21 when white alumina is used as a ceramic layer 21C in an enlarged manner.

FIG. 3A is a partially enlarged cross-sectional view illustrating a portion of the flange 13B and the flange fixation layer 21 in an enlarged manner when light reflecting ceramic (white alumina) is used as the ceramic layer 21C. The ceramic layer 21C in this case is indicated as a ceramic layer 21C(W).

Figure 3B:
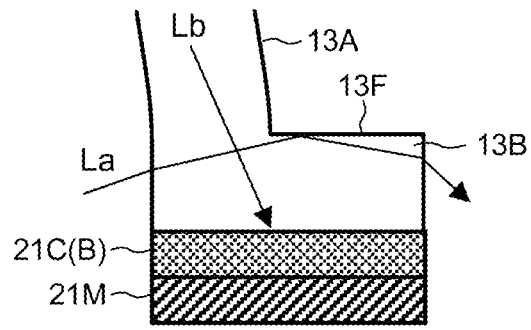
FIG. 3B is a partially enlarged cross-sectional view illustrating the portion of the flange 13B and the flange fixation layer 21 when black alumina is used as the ceramic layer 21C in an enlarged manner.

FIG. 3B is a partially enlarged cross-sectional view illustrating the portion of the flange 13B and the flange fixation layer 21 when light absorbing ceramic (black alumina) is used as the ceramic layer 21C. The ceramic layer 21C in this case is indicated as a ceramic layer 21C(B).

In this specification, the light reflecting ceramic layer 21C(W) and the light absorbing ceramic layer 21C(B) are indicated as the ceramic layer 21C unless otherwise particularly distinguished.

The flange 13B is bonded to the substrate 11 (substrate metal layer 12) by the cap bonding layer 22, but these portions are not illustrated in the figures.

When described with reference to FIG. 3A, light La entering the flange 13B from the light emitting element 15 is reflected by the flange 13B and radiated mainly to the side of the light emitting device 10. Light Lb guided from the inside of the dome portion 13A, which is the window portion, to the flange 13B is diffused and reflected by the ceramic layer 21C(W) and radiated mainly to the front of the light emitting device 10.

Accordingly, the use of the light reflecting ceramic layer 21C(W) improves the light output of the light emitting device 10. For example, emitted light can be efficiently utilized by a device provided with a reflector covering the outer periphery of the light emitting device 10 or the like.

When described with reference to FIG. 3B, the light La entering the flange 13B from the light emitting element 15 is reflected by the flange 13B and radiated to the outside of the light emitting device 10. The light Lb guided from the inside of the dome portion 13A, which is the window portion, to the flange 13B is absorbed by the ceramic layer 21C(B).

Accordingly, the use of the light absorbing ceramic layer 21C(B) can suppress stray light radiated mainly to the front of the light emitting device 10. For example, a device provided with a condenser lens or the like in front of the light emitting device 10 can prevent the entering of the stray light.

The light La entering the flange 13B from the light emitting element 15 is generated in a case where a height FL of an upper surface (surface facing the bottom surface) 13F of the flange 13B is higher than a height EL of a light emitting surface 15S of the light emitting element 15 (see FIG. 2A), for example, when measured with the upper surface of the substrate 11 as the reference height. More specifically, by positioning the upper surface 13F of the flange 13B on the rear side in the light emitting direction relative to the light emitting surface 15S of the light emitting element 15, the light La entering the flange 13B from the light emitting element 15 can be attenuated (or eliminated).

As described above, in the light emitting device 10 of this embodiment, the flange fixation layer 21 containing the ceramic layer 21C/the metal layer 21M is fixed to the flange 13B of the light transmitting cap 13. A metalized layer via a ceramic layer has high adhesion strength to glass, such as quartz glass, and prevents the peeling from the glass. Accordingly, a sealing structure can be realized in which the bond strength between the light transmitting cap 13 and the substrate 11 is high and the hermeticity is excellent.

Second Embodiment

Figure 4A:
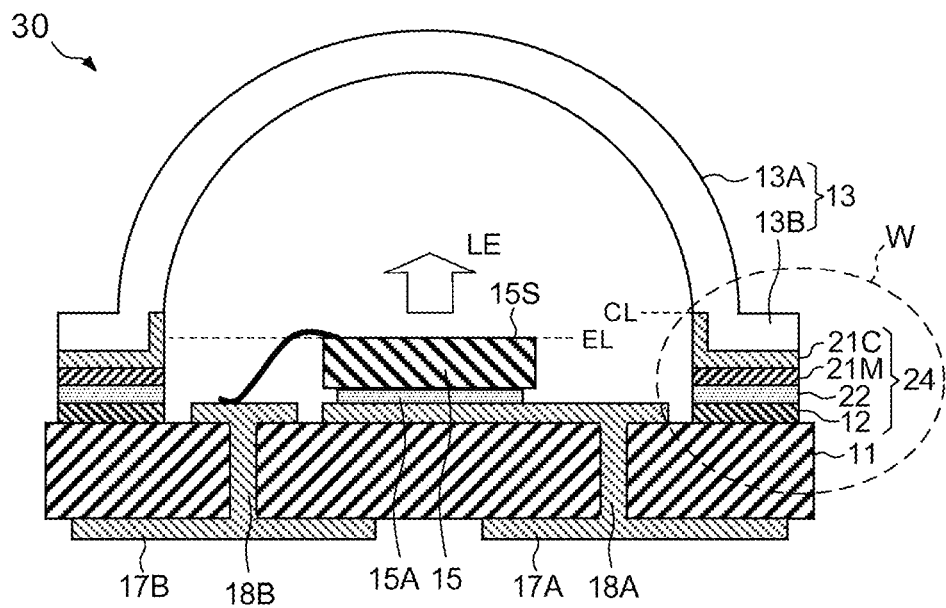
FIG. 4A is a cross-sectional view schematically illustrating the cross section of a semiconductor light emitting device 30 according to a second embodiment of the present invention.
Figure 4B:
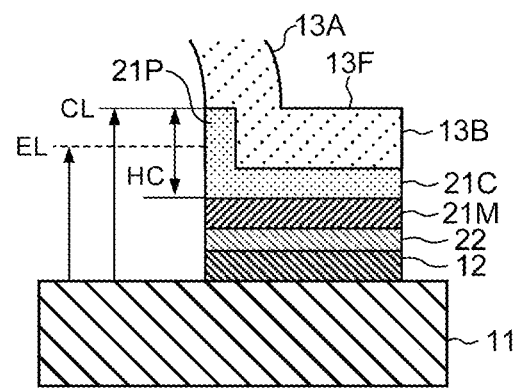
FIG. 4B is a partially enlarged cross-sectional view illustrating a bonded portion (W part) of FIG. 4A in an enlarged manner.

FIG. 4A is a cross-sectional view schematically illustrating the cross section of a semiconductor light emitting device 30 according to a second embodiment of the present invention. FIG. 4B is a partially enlarged cross-sectional view illustrating a bonded portion (W part) of FIG. 4A in an enlarged manner.

The semiconductor light emitting device 30 of this embodiment is different from the semiconductor light emitting device 10 of the first embodiment described above in that the ceramic layer 21C is formed from the bottom surface 13S of the flange 13B to the inner surface of the light transmitting cap 13.

In more detail, as illustrated in FIG. 4A and FIG. 4B, the ceramic layer 21C is formed from the bottom surface 13S of the flange 13B to the inner surface of the light transmitting cap 13 and is formed over the entire inner peripheral surface of the flange 13B. In this embodiment, the flange 13B is provided with a recessed portion in an inner peripheral portion and ceramic is welded into the recessed portion.

More specifically, the ceramic layer 21C includes a portion where ceramic is welded to the bottom surface 13S of the flange 13B and a portion where ceramic is welded into the recessed portion (ceramic layer inner peripheral portion 21P). The ceramic layer 21C has an L-shape in the cross section perpendicular to the substrate 11.

The ceramic layer inner peripheral portion 21P has a height HC (height from the bottom surface of the ceramic layer 21C) in the cross section perpendicular to the substrate 11. When the upper surface of the substrate 11 is used as the reference surface, for example, a height (level) CL of the top surface of the ceramic layer inner peripheral portion 21P is higher than the height (level) EL of the light emitting surface 15S of the light emitting element 15 with respect to the upper surface of the substrate 11. Herein, the description is given with the upper surface of the substrate 11 as the height reference. However, the height may be measured in the light emitting direction (direction perpendicular to the light emitting surface 15S) of the light emitting element 15 with a surface parallel to the light emitting surface 15S of the light emitting element 15 as the reference surface.

Next, the reflection and the absorption of an incident light when light from the light emitting element 15 enters the flange 13B are described with reference to FIG. 5A, FIG. 5B, and FIG. 5C.

Figure 5A:
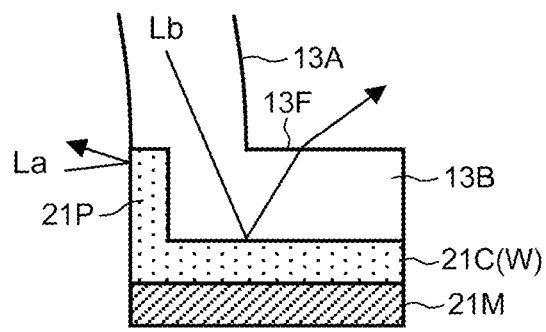
FIG. 5A is a partially enlarged cross-sectional view illustrating a case where the ceramic layer 21C is a light reflecting ceramic layer 21C(W).
Figure 5B:
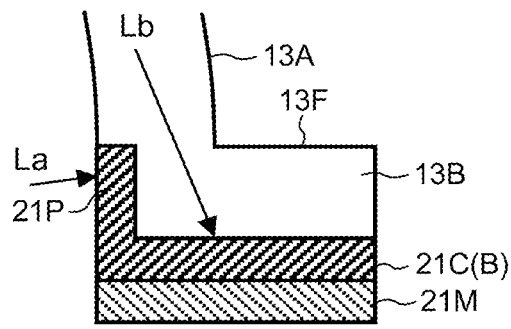
FIG. 5B is a partially enlarged cross-sectional view illustrating a case where the ceramic layer 21C is a light absorbing ceramic layer 21C(B).
Figure 5C:
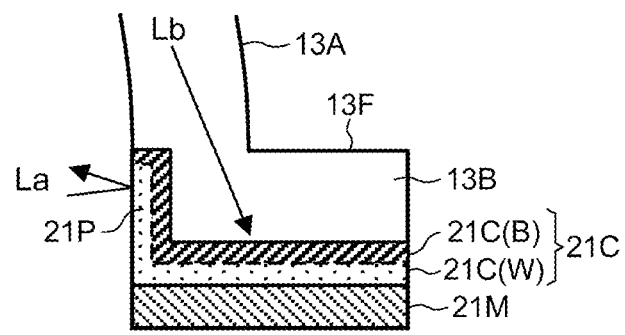
FIG. 5C is a partially enlarged cross-sectional view illustrating a case where the ceramic layer 21C contains the light absorbing ceramic layer 21C(B) and the light reflecting ceramic layer 21C(W) (two-layer structure).

FIG. 5A is a partially enlarged cross-sectional view illustrating a case where the ceramic layer 21C is the light reflecting ceramic layer 21C(W). FIG. 5B is a partially enlarged cross-sectional view illustrating a case where the ceramic layer 21C is the light absorbing ceramic layer 21C(B). FIG. 5C is a partially enlarged cross-sectional view illustrating a case where the ceramic layer 21C contains the light absorbing ceramic layer 21C(B) welded to the flange 13B and the light reflecting ceramic layer 21C(W) formed on the ceramic layer 21C(B) (two-layer structure).

When described with reference to FIG. 5A, the light La entering the flange 13B from the light emitting element 15 is diffused and reflected to be blocked by the inner peripheral portion 21P of the reflective ceramic layer 21C(W). Then, the reflected light is converted into emitted light of the light emitting device 10. The light Lb guided from the dome portion 13A, which is the window portion, to the flange 13B is diffused and reflected by the ceramic layer 21C(W) and radiated mainly to the front of the light emitting device 10.

Accordingly, the light output can be improved while suppressing light emitted from the outer surface of the flange 13B of the light emitting device 10.

When described with reference to FIG. 5B, the light La entering the flange 13B from the light emitting element 15 and the light Lb guided from the dome portion 13A to the flange 13B are absorbed by the ceramic layer 21C(B).

Accordingly, the output of invisible light, such as ultraviolet light or infrared light, from a peripheral portion of the light emitting device 10 can be prevented.

When described with reference to FIG. 5C, the light La entering the flange 13B from the light emitting element 15 is diffused and reflected to be blocked by the ceramic layer 21C(W). Then, the reflected light is converted into emitted light of the light emitting device 10. The light Lb guided to the flange 13B is absorbed by the ceramic layer 21C(B) and can be prevented from being emitted from the light emitting device 10.

Accordingly, the light output can be improved while suppressing the output of invisible light, such as ultraviolet light or infrared light, from a peripheral portion of the light emitting device 10.

Figure 6:
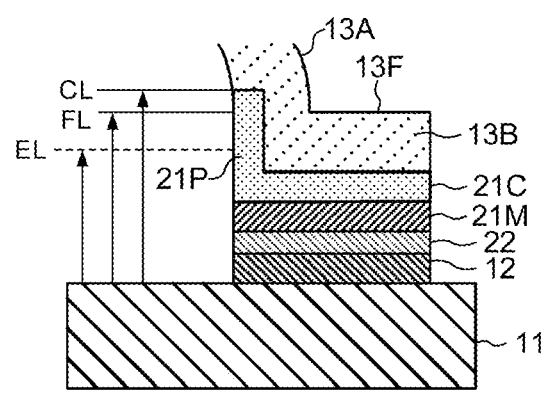
FIG. 6 is a partially enlarged cross-sectional view illustrating a case where the height of the top surface of a ceramic layer inner peripheral portion 21P exceeds the height of an upper surface 13F of the flange 13B.

In terms of blocking the light emitted from the side surface of the light emitting element 15 (the side surface of the flange 13B), it is preferable that the height CL of the ceramic layer inner peripheral portion 21P is equal to the height of the upper surface 13F of the flange 13B or the top surface of the inner peripheral portion 21P reaches the inside of the dome portion 13A and the inner peripheral portion 21P (height CL of the top surface) has a height exceeding the upper surface 13F (height FL) of the flange 13B (CL>FL) as illustrated in FIG. 6.

As described in the first embodiment, the light La entering the flange 13B from the light emitting element 15 is generated in a case where the height FL of the upper surface (surface facing the bottom surface) 13F of the flange 13B is higher than the height EL of the light emitting surface 15S of the light emitting element 15, for example, when measured with the upper surface of the substrate 11 as the reference height (see FIG. 2A). More specifically, by positioning the upper surface 13F of the flange 13B on the rear side in the light emitting direction relative to the light emitting surface 15S of the light emitting element 15, the light La entering the flange 13B from the light emitting element 15 can be attenuated (or eliminated).

[Modification]

Figure 7:
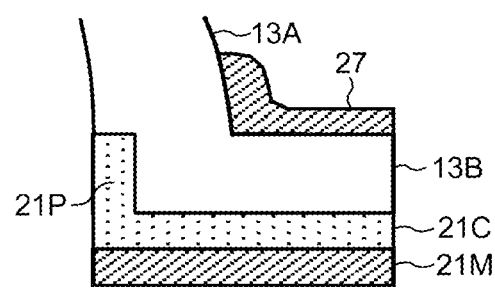
FIG. 7 is a schematic partially enlarged cross-sectional view illustrating the cross section of the portion of the flange 13B and the flange fixation layer 21 according to a modification of the second embodiment in an enlarged manner.

FIG. 7 is a schematic partially enlarged cross-sectional view illustrating the cross section of the portion of the flange 13B and the flange fixation layer 21 according to a modification of the second embodiment in an enlarged manner.

In this modification, a light blocking layer 27 containing ceramic is provided at least on the upper surface of the flange 13B. The flange 13B can block light emitted to the front of the semiconductor light emitting device 30 by the light blocking layer 27. The light blocking layer 27 is suitably formed of light absorbing ceramic, e.g., black alumina.

As described above, the ceramic has high adhesion strength to glass and also has high weather resistance, and therefore does not deteriorate when installed on the surfaces of the dome portion 13A and the flange 13B. Therefore, the semiconductor light emitting device 30 with a long life can be realized.

In the second embodiment described above, the description is given taking the case where the flange 13B is provided with the recessed portion in the inner peripheral portion and ceramic is welded into the recessed portion as an example but the present invention is not limited thereto. For example, a structure may be adopted in which the recessed portion is not provided in the light transmitting cap 13 and a ceramic layer is welded onto the inner surface of the flange 13B of the first embodiment.

As described above, in the light emitting device 30 of this embodiment, the ceramic layer is fixed not only to the bottom surface of the flange 13B but to the entire inner peripheral surface of the flange 13B. Accordingly, the adhesion strength to glass, such as quartz glass, is higher, and thus the peeling from the glass can be prevented. Accordingly, a sealing structure can be realized in which the bond strength between the light transmitting cap 13 and the substrate 11 is high and the hermeticity is excellent.

As described above in detail, the semiconductor light emitting device according to this embodiment can provide the semiconductor device having high reliability with which high hermeticity is maintained even in long-term use and high environmental resistance, such as moisture resistance and corrosion resistance.

REFERENCE SIGNS LIST 10, 30 semiconductor light emitting devices
11 substrate
12 substrate metal layer
12S substrate bonding surface
13 light transmitting cap
13A window portion
13B flange
15 semiconductor light emitting element
21 flange fixation layer
21C, 21C(W), 21C(B) ceramic layer
21M metal layer (flange metal layer)
21P ceramic layer inner peripheral portion

What is claimed is:
1. A semiconductor light emitting device comprising:
a semiconductor light emitting element;
a substrate on which the semiconductor light emitting element is mounted and which includes a substrate bonding surface to which a substrate metal layer having an annular shape is fixed; and
a light transmitting cap including a window portion containing glass and transmitting radiation light of the semiconductor light emitting element and a flange having a bottom surface to which an annular flange fixation layer having a size corresponding to the substrate metal layer is fixed, and sealed and bonded to the substrate with a space housing the semiconductor light emitting element by bonding of the flange fixation layer to the substrate metal layer, wherein
the flange fixation layer contains a ceramic layer welded to the flange and a metal layer formed on the ceramic layer.

2. The semiconductor light emitting device according to claim 1, wherein the ceramic layer has a ceramic layer inner peripheral portion formed from a bottom surface of the flange to an inner surface of the light transmitting cap and fixed over an entire inner peripheral surface of the flange.

3. The semiconductor light emitting device according to claim 2, wherein the flange has a recessed portion in an inner peripheral portion and the ceramic layer inner peripheral portion is formed by welding of ceramic into the recessed portion.

4. The semiconductor light emitting device according to claim 3, wherein a height of a top surface of the ceramic layer inner peripheral portion is equal to or larger than a height of a light emitting surface of the semiconductor light emitting element in a case of being measured in a light emitting direction of the semiconductor light emitting element.

5. The semiconductor light emitting device according to claim 2, wherein an upper surface of the flange is positioned on a rear side in a light emitting direction of the semiconductor light emitting element relative to a light emitting surface of the semiconductor light emitting element.

6. The semiconductor light emitting device according to claim 2, wherein a height of a top surface of the ceramic layer inner peripheral portion is equal to or larger than a height of a light emitting surface of the semiconductor light emitting element in a case of being measured in a light emitting direction of the semiconductor light emitting element.

7. The semiconductor light emitting device according to claim 6, wherein the ceramic layer is a black alumina layer.

8. The semiconductor light emitting device according to claim 6, wherein the ceramic layer contains a black alumina layer welded to the flange and a white alumina layer welded onto the black alumina layer.

9. The semiconductor light emitting device according to claim 2, wherein the ceramic layer is a black alumina layer.

10. The semiconductor light emitting device according to claim 2, wherein the ceramic layer contains a black alumina layer welded to the flange and a white alumina layer welded onto the black alumina layer.

11. The semiconductor light emitting device according to claim 1, wherein the ceramic layer is a black alumina layer.

12. The semiconductor light emitting device according to claim 1, wherein the ceramic layer contains a black alumina layer welded to the flange and a white alumina layer welded onto the black alumina layer.

13. The semiconductor light emitting device according to claim 1, wherein the ceramic layer contains at least one of alumina, silicon carbide, silicon nitride, aluminum nitride, and zirconia.

* * * * *